(12) United States Patent
Zheng et al.

(10) Patent No.: US 11,271,186 B2
(45) Date of Patent: Mar. 8, 2022

(54) FLEXIBLE OLED DISPLAY PANEL WITH CURVED SURFACE AND MANUFACTURING METHOD THEREOF

(71) Applicant: Wuhan China Star Optoelectronics Semiconductor Display Technology Co., Ltd., Wuhan (CN)

(72) Inventors: Min Zheng, Wuhan (CN); Mugyeom Kim, Wuhan (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 58 days.

(21) Appl. No.: 16/897,314

(22) Filed: Jun. 10, 2020

(65) Prior Publication Data
US 2021/0343986 A1 Nov. 4, 2021

(30) Foreign Application Priority Data

Apr. 29, 2020 (CN) .......................... 202010357555.7

(51) Int. Cl.
*H01L 51/52* (2006.01)
*H01L 27/32* (2006.01)
*H01L 51/00* (2006.01)
*H01L 51/56* (2006.01)

(52) U.S. Cl.
CPC ...... *H01L 51/5256* (2013.01); *H01L 27/3244* (2013.01); *H01L 51/0097* (2013.01); *H01L 51/5281* (2013.01); *H01L 51/56* (2013.01); *H01L 2227/323* (2013.01); *H01L 2251/5338* (2013.01)

(58) Field of Classification Search
None
See application file for complete search history.

(56) References Cited

U.S. PATENT DOCUMENTS

| | | | | |
|---|---|---|---|---|
| 2014/0061624 | A1* | 3/2014 | Nagata | H01L 51/5246 257/40 |
| 2015/0060806 | A1* | 3/2015 | Park | H01L 27/3246 257/40 |
| 2017/0012243 | A1* | 1/2017 | Suzuki | H01L 27/3258 |
| 2018/0033998 | A1* | 2/2018 | Kim | H01L 27/3246 |
| 2018/0248148 | A1* | 8/2018 | Suzuki | H01L 51/5246 |
| 2020/0067016 | A1* | 2/2020 | Park | H01L 27/3276 |
| 2021/0066653 | A1* | 3/2021 | Luo | H01L 51/5246 |
| 2021/0193783 | A1* | 6/2021 | Kim | H01L 27/3276 |
| 2021/0249626 | A1* | 8/2021 | Luo | H01L 51/56 |

* cited by examiner

*Primary Examiner* — J. E. Schoenholtz
(74) *Attorney, Agent, or Firm* — Nathan & Associates; Nathan Menachem

(57) ABSTRACT

A flexible OLED display panel and a method of manufacturing thereof are provided. The flexible OLED display panel includes a display area, and a non-display area surrounding the display area and having a corner sub-area located at a corner of the flexible substrate. A dam surrounding the display area is formed within the non-display area of a TFT layer. At least one groove is disposed on at least one lateral side of the dam in the corner sub-area of the TFT layer, and an undercut structure is formed on an inner wall of the groove. The dam is located on the TFT layer and extended to a luminescent layer, and the groove adjacent to the dam extends into the flexible substrate. Thereby, buffering and releasing the bending stress of the OLED display panel.

10 Claims, 3 Drawing Sheets

FLEXIBLE OLED DISPLAY PANEL WITH CURVED SURFACE AND MANUFACTURING METHOD THEREOF

BACKGROUND OF INVENTION

Field of Invention

The present invention relates to the field of display technology, and more particularly, to a flexible OLED display panel and a manufacturing method thereof.

Description of Prior Art

With the development of display technology, flexible organic light emitting diode (OLED) display panels have been widely used in various fields due to their advantages such as rollability, small footprints, self-illumination, flexible display and large-area full color gamut display.

The conventional flexible OLED display panel is mainly disposed on the flexible substrate by sequentially stacking each of the functional layers in the display panel. During the bending process, due to the different deformation degree existed between the different functional layers, the local stress concentration may be caused, thereby damaging the structure. It may affect the normal use of the display panel, especially the rounded corner area of the OLED display panel may be easily cracked, and water and oxygen may invade from the crack to a lateral side of the luminescent layer, which seriously affects the display quality and service life of the luminescent device.

Therefore, the rounded corner area of the flexible OLED display panel of the conventional technique is prone to the technical problems of film separation, delamination, or fragmentation, which are needed to be improved.

SUMMARY OF INVENTION

The present invention provides a flexible OLED display panel, which may solve the conventional technique with problems of film separation, delamination or fragmentation.

To solve the abovementioned technical problems, the solution provided by the present invention is shown as follows:

The present invention provides an OLED display panel, comprising: a flexible substrate, a TFT layer, a luminescent layer and an encapsulation layer. The TFT layer is disposed on one side of the flexible substrate and comprises a display area and a non-display area surrounding the display area. The non-display area comprises a corner sub-area located at a corner of the flexible substrate. A dam surrounding the display area is formed within the non-display area of the TFT layer, at least one groove is disposed on at least one lateral side of the dam in the corner sub-area of the TFT layer, and an undercut structure is formed on an inner wall of the groove. The luminescent layer is disposed on one side of the TFT layer away from the flexible substrate, and the luminescent layer covers the dam and the groove. The encapsulation layer is disposed on one side of the luminescent layer away from the TFT layer, and the encapsulation layer covers the dam and the groove.

According to one prefer embodiment of the present invention, a number of the corner sub-areas is four, a shape of the dam distributed in each of the corner sub-areas is the same as a shape of the groove, and shapes of the four corner sub-areas are the same.

According to one prefer embodiment of the present invention, the dam and the groove adjacent to the dam form an arc surface, a wavy surface, or a zigzag surface with ups and downs.

According to one prefer embodiment of the present invention, a first sub-groove and a second sub-groove are respectively formed on two lateral sides of the dam, and a shape of the first sub-groove is the same as a shape of the second sub-groove.

According to one prefer embodiment of the present invention, a first undercut structure is formed on an inner wall of the first sub-groove, a second undercut structure is formed on an inner wall of the second sub-groove, and a shape of the first undercut structure and the second undercut structure is arc, wavy or oblique.

According to one prefer embodiment of the present invention, the flexible substrate comprises a laminated stack of a first flexible layer, a waterproof layer, and a second flexible layer. A buffer layer, a gate insulation layer, an insulation interlayer, and a first flatten layer are disposed on the TFT layer corresponding to the corner sub-areas. The groove from top to bottom is etched and formed in at least one insulation layer of the insulation interlayer, the gate insulation layer, the buffer layer, and the second flexible layer. The dam is formed on the first flatten layer.

According to one prefer embodiment of the present invention, the encapsulation layer comprises a laminated stack of a first inorganic layer, an organic layer, and a second inorganic layer. The first inorganic layer, the organic layer, and the second inorganic layer are deposited in the groove, and the second inorganic layer protrudes from the groove.

According to one prefer embodiment of the present invention, a pixel defining layer is disposed on the luminescent layer corresponding to the corner sub-area, a spacer layer is disposed on a surface of the pixel defining layer, and the dam extends into the pixel defining layer and the spacer layer.

According to one prefer embodiment of the present invention, the flexible OLED display panel further comprises a second flatten layer disposed on a surface of the encapsulation layer, a touch layer disposed on a surface of the second flatten layer, and a polarizing layer disposed on a surface of the touch layer.

According to the flexible OLED display panel describe above, the present invention further provides a method of manufacturing a flexible OLED display, comprising:

a step 1 of providing a flexible substrate and preparing a TFT layer on a surface of the flexible substrate, the flexible substrate comprises a display area and a non-display area surrounding the display area, and the non-display area comprises a corner sub-area located at a corner of the flexible substrate;

a step 2 of forming a dam surrounding the display area within the non-display area of the TFT layer, forming at least one groove on at least one lateral side of the dam within the corner sub-area of the TFT layer, an undercut structure is formed on an inner wall of the groove, and the undercut structure is located in the flexible substrate; and a step 3 of sequentially preparing a luminescent layer and an encapsulation layer in order on a surface of the TFT layer, both of the luminescent layer and the encapsulation layer cover the dam and the groove; and sequentially preparing a second flatten layer, a touch layer, and a polarizing layer in order on a surface of the encapsulation layer.

The beneficial effect of the present invention: the flexible OLED display panel comprises the display area and the non-display area surrounding the display area. The non-display area comprises the corner sub-areas located at the corners of the flexible substrate. The dam surrounding the display area is formed within the non-display area of the TFT layer, at least one groove is formed on at least one lateral side of the dam within the corner sub-area of the TFT layer, and the undercut structure is formed on the inner wall of the groove. Compared with a conventional OLED display panel, the dam of the present invention is located on the TFT layer and extended to the luminescent layer, and the groove adjacent to the dam extends into the flexible substrate. Thereby, the dam and the adjacent groove form an arc surface, a wavy surface, or a zigzag surface with ups and downs. Such curved surface may buffer and release the bending stress of the OLED display panel, avoid forming cracks at the edge of the encapsulation layer, and effectively prevent water and oxygen from invading the luminescent layer, thereby enhancing the display quality of the OLED display panel.

BRIEF DESCRIPTION OF DRAWINGS

In order to more clearly illustrate the technical solutions in the embodiments of the present invention, the drawings used in the description of the embodiments will be briefly described below. It is obvious that the drawings in the following description are only some embodiments of the present invention. Other drawings can also be obtained from those skilled persons in the art based on these drawings without making any creative effort.

DETAILED DESCRIPTION OF PREFERRED EMBODIMENTS

Figure 1:
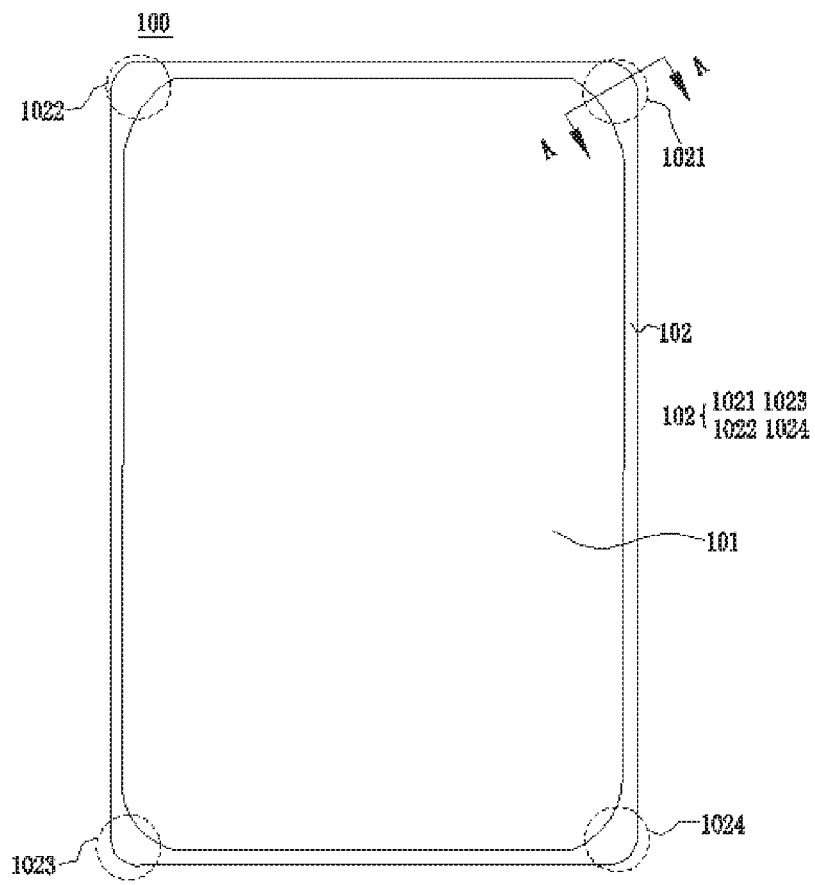
FIG. 1 is a schematic view of the flexible OLED display panel according to one embodiment of the present invention.

The description of each of the following embodiments is provided with reference to the appending drawings to exemplify the specific embodiment that may be implemented. The terms, such as "upper," "lower," "front," "back," "left," "right," "inside," "outside," "lateral sides," etc. are based on the orientational or positional relationship shown in the drawings, and the terms are merely for convenience of description of the present invention, and thus they are not to be construed as limiting. In the drawings, similar units of the structures are shown in the same symbols. The dotted line shown in the figure indicates that it does not exist in the structure, and only illustrates the shape and position of the structure.

The embodiments of the present invention may solve the technical problems that the rounded corner area of the flexible OLED display panel of the conventional technique is prone to film separation, delamination or fragmentation.

As shown in FIG. 1, one embodiment of the present invention provides a flexible OLED display panel 100. The flexible OLED display panel 100 comprises a flexible substrate, a TFT layer, and an encapsulation layer. The TFT layer is disposed on one side of the flexible substrate and comprises a display area 101 and a non-display area 102 surrounding the display area 101. The non-display area 102 comprises a corner sub-area located at a corner of the flexible substrate. A dam surrounding the display area is formed within the non-display area of the TFT layer (not indicated in FIG. 1). At least one groove is disposed on at least one lateral side of the dam in the corner sub-area of the TFT layer (not indicated in FIG. 1), and an undercut structure is formed on an inner wall of the groove. Preferably, the shape of the undercut structure is arc, wavy or oblique. The luminescent layer is disposed on one side of the TFT layer away from the flexible substrate, and the luminescent layer covers the dam and the groove. The encapsulation layer is disposed on one side of the luminescent layer away from the TFT layer, and the encapsulation layer covers the dam and the groove. The flexible OLED display panel 100 of the embodiment further comprises a second flatten layer disposed on the encapsulation layer, a touch layer disposed on a surface of the second flatten layer, and a polarizing layer disposed on a surface of the touch layer. The corner sub-area comprises a first corner sub-area 1021, a second corner sub-area 1022, a third corner sub-area 1023, and a corner sub-area 1024.

Due to the repeated bending of the flexible OLED display panel 100, the different film layers of the flexible OLED display panel 100 have different deformation degrees. If the corresponding stress cannot be released or buffered in time, the local stress concentration will be caused, resulting in cracks formed the film layers. Water and oxygen may invade the side of the luminescent layer, which affects the normal use of the display panel. In particular, the corner sub-area of the OLED display panel 100 is more easily to be cracked. To solve this problem, the inventors provided the dam and the groove in the corner sub-area corresponding to the flexible substrate and the surface of the TFT layer. The dam extends from the first flatten layer on the TFT layer to the spacer layer on the light-emitting function layer. The groove adjacent to the dam extends to the inside of the flexible substrate. The dam and the adjacent groove form the arc surface, the wavy surface, or the zigzag surface with ups and downs. As such, the curved surface may buffer and release the bending stress of the OLED display panel, avoid forming cracks at the edge of the encapsulation layer, and effectively prevent water and oxygen from invading the luminescent layer, thereby enhancing the display quality of the OLED display pane.

Specifically, the shapes of the first corn sub-area 1021, the second corner sub-area 1022, the third corner sub-area 1023, and the corner sub-area 1024 are the preferred same. The distribution and the shapes of the dams and the grooves in the first corn sub-area 1021, the second corner sub-area 1022, the third corner sub-area 1023, and the corner sub-area 1024 are the same. As such, the dam and the groove of the first corn sub-area 1021 are used to illustrate the concept of the present invention.

Figure 2:
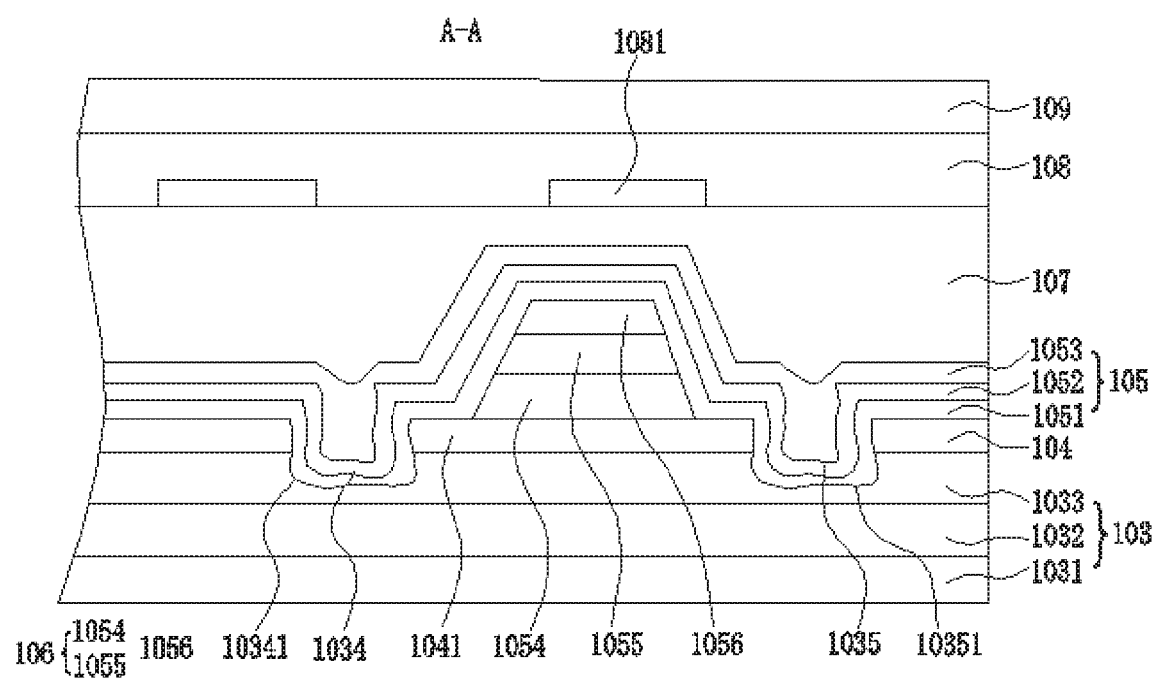
FIG. 2 is a schematic view of the cross-section A-A of the flexible OLED display panel according to one embodiment of the present invention.

FIG. 2 is a schematic view of the cross-section A-A of FIG. 1, that is, the schematic view of the first corn sub-area 1021. As shown in FIG. 2, the flexible substrate 103 comprises a laminated stack of a first flexible layer 1031, a waterproof layer 1032, and a second flexible layer 1033. The TFT layer is disposed on a surface of the second flexible layer 1033, an insulation layer 104 and a first flatten layer 1054 disposed a surface of the insulation layer 104 are disposed on the TFT layer corresponding to the first corn sub-area 1021. The insulation layer 104 comprises a buffer layer, a gate insulation layer, an insulation interlayer. The dam 106 is formed on the luminescent layer corresponding to the first corn sub-area 1021. The dam 106 comprises a partially laminated stacks of the first flatten layer 1054, a pixel defining layer 1055, and the spacer layer 1056. The cross-sectional shape of the dam 106 is trapezoidal, and a first sub-groove 1034 and a second sub-groove 1035 are respectively provided on both sides of the dam 106. The first sub-groove 1034 and the second sub-groove 1035 are preferably integrally formed and have the same shape. The first sub-groove 1034 and the second sub-groove 1035 are etched from top to bottom in the insulation interlayer, the gate insulation layer, the buffer layer, and the second flexible layer, and both of the first sub-groove 1034 and the second sub-groove 1035 fill a part of the encapsulation layer 105. The encapsulation layer 105 comprises a first inorganic layer 1051, an organic layer 1052, and a second inorganic layer 1053. A first undercut structure 10341 is formed on an inner wall of the first sub-groove 1034, and a second undercut structure 10351 is formed on an inner wall of the second sub-groove 1035. The shapes of both the first undercut structure 10341 and the second undercut structure 10351 are arc or oblique. The dam 106, the first sub-groove 1034 adjacent to the dam 106, and the second sub-groove 1035 adjacent to the dam 106 form an arc surface, a wavy surface, or a zigzag surface with ups and downs.

The OLED display panel of the embodiment further comprises a flatten layer 107 disposed on a surface of the encapsulation layer 105, a touch layer 108 disposed on a surface of the flatten layer 107, and a polarizing layer 109 disposed on a surface of the touch layer 108. A touch signal line 1081 is disposed on a bottom of the touch layer 108.

In another embodiment, the shapes of the first sub-groove 1034 and the second sub-groove 1035 may be different. The first sub-groove 1034 and the second sub-groove 1035 are etched and formed in at least one insulation layer of the insulation interlayer, the gate insulation layer, the buffer layer, and the second flexible layer. The dam is a combined film layer of the first flatten layer, the pixel defining layer, and the spacer layer. The dam may also be one or two film layers of the first flatten layer, the pixel defining layer, and the spacer layer.

Figure 3:
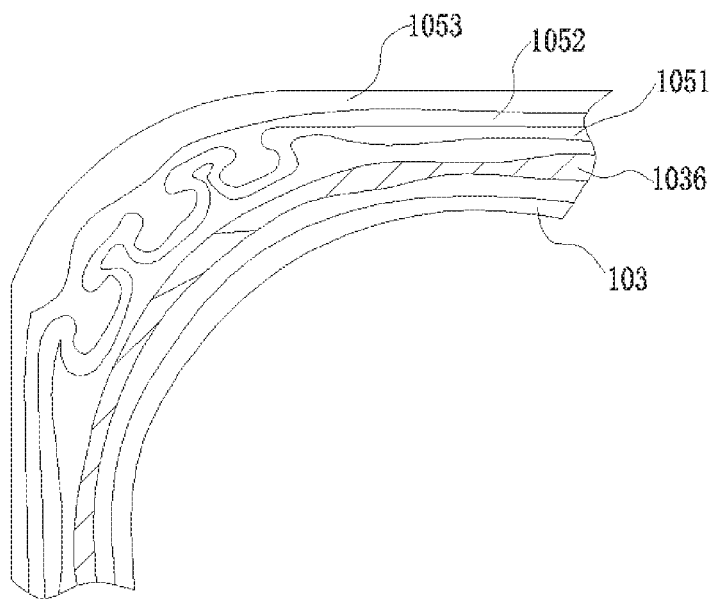
FIG. 3 is a schematic view of the film distribution in the corner sub-area of the flexible OLED display panel according to one embodiment of the present invention.

As shown in FIG. 3, one embodiment of the present application provides a schematic view of the distribution of the corner sub-areas in an OLED display panel. A plurality of grooves and dams are formed at intervals in the flexible substrate 103 corresponding to the first corner sub-area 1021 to form a ring-shaped contact surface. The first inorganic layer 1051 is attached to the annular ring-shaped contact surface, the organic layer 1052 is attached to the first inorganic layer 1051, and the second inorganic layer 1053 is attached to the organic layer 1052.

Figure 4:
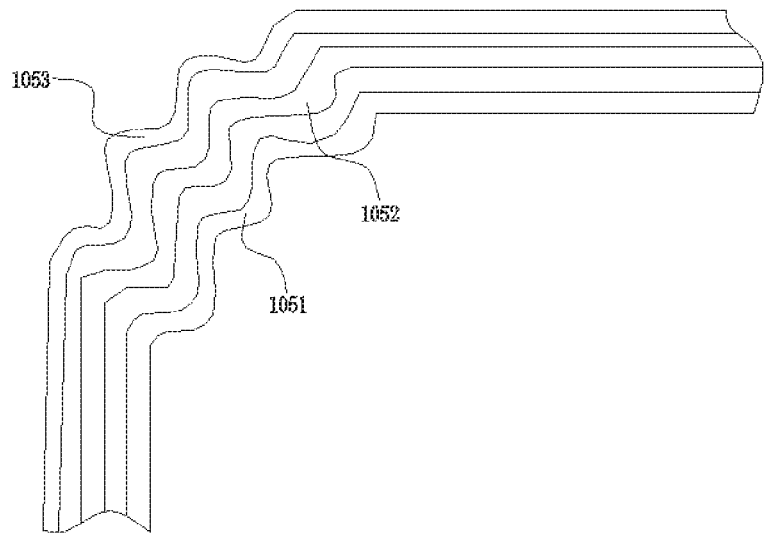
FIG. 4 is another schematic view of the film distribution in the corner sub-area of the flexible OLED display panel according to one embodiment of the present invention.

As shown in FIG. 4, one embodiment of the present invention provides another schematic view of an unfolded structure of the corner sub-area in the OLED display panel. The groove and the dam in the first corner sub-area 1021 form a wavy surface or a zigzag surface. The first inorganic layer 1051, the organic layer 1052, and the second inorganic layer 1053 are disposed along the wavy surface or the zigzag surface.

Figure 5:
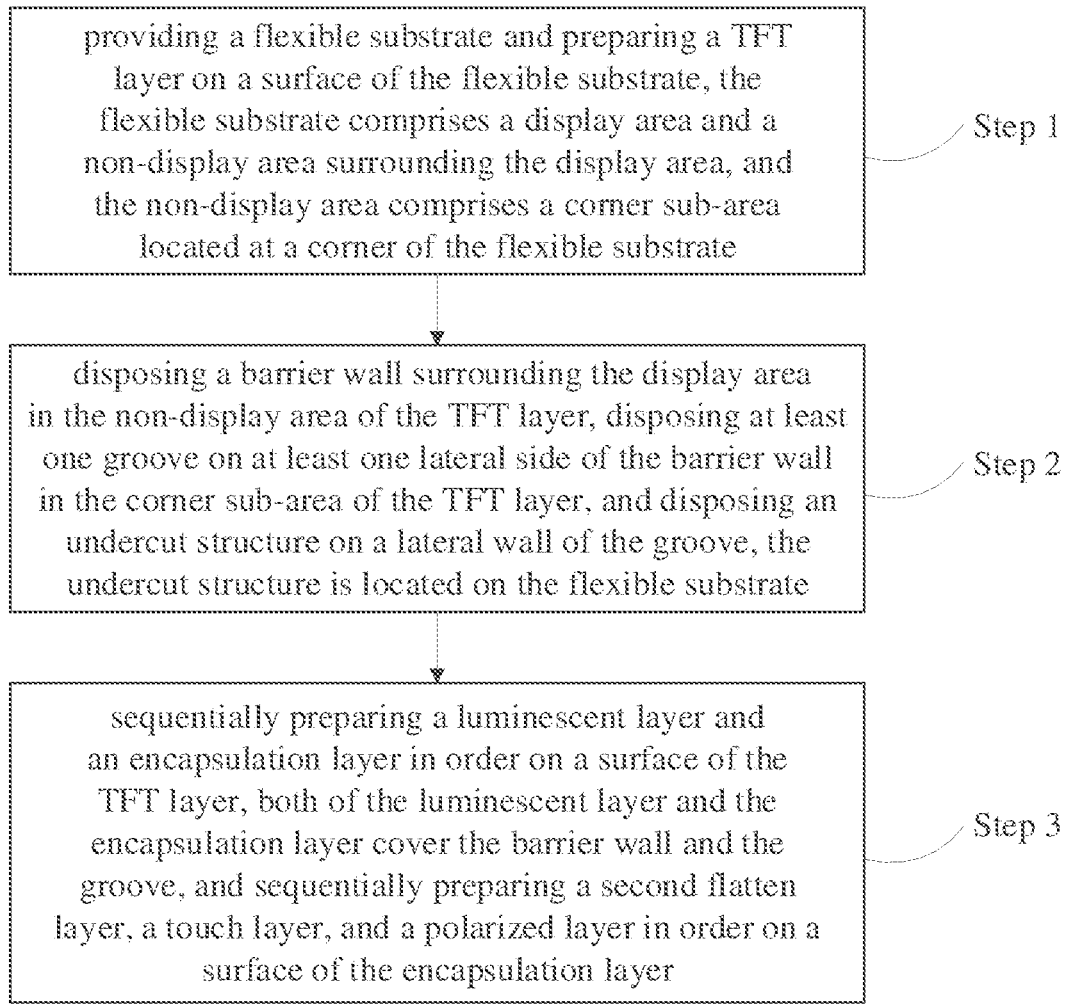
FIG. 5 is a flowchart of a method of manufacturing the flexible OLED display panel according to one embodiment of the present invention.

According to the flexible OLED display panel described above, as shown in FIG. 5, the present invention further provides a method of manufacturing a flexible OLED display panel, the method comprises:

a step 1 of providing a flexible substrate and preparing a TFT layer on a surface of the flexible substrate, wherein the flexible substrate comprises a display area and a non-display area surrounding the display area, and the non-display area comprises a corner sub-area located at a corner of the flexible substrate.

a step 2 of forming a dam surrounding the display area within the non-display area of the TFT layer, and forming at least one groove on at least one lateral side of the dam within the corner sub-area of the TFT layer, wherein an undercut structure is formed on an inner wall of the groove, and the undercut structure is located in the flexible substrate; and a step 3 of sequentially preparing a luminescent layer and an encapsulation layer in order on a surface of the TFT layer, wherein both of the luminescent layer and the encapsulation layer cover the dam and the groove; and sequentially preparing a second flatten layer, a touch layer, and a polarizing layer in order on a surface of the encapsulation layer.

Preferably, a dam surrounding the display area is formed within the non-display area of the TFT layer. At least one groove is formed on at least one lateral side of the dam within the corner sub-area of the TFT layer. An undercut structure is formed on an inner wall of the groove, and the step 2 of the undercut structure in the flexible substrate specifically comprises forming the arc surface, the wavy surface, or the zigzag surface with ups and downs and falls by the dam and the adjacent groove adjacent to the dam. The dam extends into the spacer layer of the luminescent layer, and the groove is etched and formed from the insulation interlayer of the TFT layer to the second flexible layer of the flexible substrate.

The present invention provides the flexible OLED display panel and the method of manufacturing thereof. The flexible OLED display panel comprises the display area and the non-display area surrounding the display area. The non-display area comprises the corner sub-area located at the corner of the flexible substrate. A dam surrounding the display area is formed within the non-display area of the TFT layer. At least one groove is disposed on at least one lateral side of the dam in the corner sub-area of the TFT layer, and the undercut structure is formed on the inner wall of the groove. Compared to a conventional OLED display panel, the dam of the present invention is located on the TFT layer and extended to the luminescent layer, and the groove adjacent to the dam extends into the flexible substrate. Thereby, the dam and the adjacent groove form the arc surface, the wavy surface, or the zigzag surface with ups and downs. Such curved surface may buffer and release the bending stress of the OLED display panel, avoid forming cracks at the edge of the encapsulation layer, and effectively prevent water and oxygen from invading the luminescent layer, thereby enhancing the display quality of the OLED display panel.

Based on the above, although the present invention has been disclosed as above with the preferred embodiments, the above preferred embodiments are not intended to limit scope of the present invention. A person ordinarily skilled in the art may make various changes and modifications without departing from the spirit and scope of the present invention. Therefore, the claimed scope of the present invention is defined by claims of the present invention.

What is claimed is:

1. A flexible OLED display panel, comprising:
   a flexible substrate;
   a TFT layer disposed on one side of the flexible substrate, and comprising a display area and a non-display area surrounding the display area, wherein the non-display area comprises a plurality of corner sub-areas, wherein at least one corner sub-area is located at a corner of the flexible substrate, wherein a dam surrounding the display area is formed within the non-display area of the TFT layer, at least one groove is disposed on at least one lateral side of the dam in the corner sub-area of the TFT layer, and an undercut structure is formed on an inner wall of the groove;

a luminescent layer disposed on one side of the TFT layer away from the flexible substrate, wherein the luminescent layer covers the dam and the groove; and an encapsulation layer disposed on one side of the luminescent layer away from the TFT layer, wherein the encapsulation layer covers the dam and the groove.

2. The flexible OLED display panel according to claim 1, wherein a number of the corner sub-areas is four, a shape of the dam distributed in each of the corner sub-areas is the same as a shape of the groove, and shapes of the four corner sub-areas are the same.

3. The flexible OLED display panel according to claim 2, wherein the dam and the groove adjacent to the dam form an arc surface, a wavy surface, or a zigzag surface with ups and downs.

4. The flexible OLED display panel according to claim 3, wherein a first sub-groove and a second sub-groove are respectively formed on two lateral sides of the dam, and a shape of the first sub-groove is the same as a shape of the second sub-groove.

5. The flexible OLED display panel according to claim 4, wherein a first undercut structure is formed on an inner wall of the first sub-groove, a second undercut structure is formed on an inner wall of the second sub-groove, and a shape of the first undercut structure and the second undercut structure is arc, wavy or oblique.

6. The flexible OLED display panel according to claim 1, wherein the flexible substrate comprises a laminated stack of a first flexible layer, a waterproof layer, and a second flexible layer, wherein a buffer layer, a gate insulation layer, an insulation interlayer, and a first flatten layer are disposed on the TFT layer corresponding to the corner sub-areas, wherein the groove from top to bottom is etched and formed in at least one insulation layer of the insulation interlayer, the gate insulation layer, the buffer layer, and the second flexible layer, and wherein the dam is formed on the first flatten layer.

7. The flexible OLED display panel according to claim 6, wherein the encapsulation layer comprises a laminated stack of a first inorganic layer, an organic layer, and a second inorganic layer, wherein the first inorganic layer, the organic layer, and the second inorganic layer are deposited in the groove, and wherein the second inorganic layer protrudes from the groove.

8. The flexible OLED display panel according to claim 6, wherein a pixel defining layer is disposed on the luminescent layer corresponding to the corner sub-area, a spacer layer is disposed on a surface of the pixel defining layer, and the dam extends into the pixel defining layer and the spacer layer.

9. The flexible OLED display panel according to claim 1, wherein the flexible OLED display panel further comprises a second flatten layer disposed on a surface of the encapsulation layer, a touch layer disposed on a surface of the second flatten layer, and a polarizing layer disposed on a surface of the touch layer.

10. A method of manufacturing a flexible OLED display, comprising:

a step 1 of providing a flexible substrate and preparing a TFT layer on a surface of the flexible substrate, wherein the flexible substrate comprises a display area and a non-display area surrounding the display area, and wherein the non-display area comprises a corner sub-area located at a corner of the flexible substrate;

a step 2 of forming a dam surrounding the display area within the non-display area of the TFT layer, forming at least one groove on at least one lateral side of the dam within the corner sub-area of the TFT layer, wherein an undercut structure is formed on an inner wall of the groove, and the undercut structure is located in the flexible substrate; and a step 3 of sequentially preparing a luminescent layer and an encapsulation layer in order on a surface of the TFT layer, wherein both of the luminescent layer and the encapsulation layer cover the dam and the groove; and sequentially preparing a second flatten layer, a touch layer, and a polarizing layer in order on a surface of the encapsulation layer.

* * * * *